(12) United States Patent
Lam

(10) Patent No.: US 7,971,123 B2
(45) Date of Patent: Jun. 28, 2011

(54) MULTI-BIT ERROR CORRECTION SCHEME IN MULTI-LEVEL MEMORY STORAGE SYSTEM

(75) Inventor: Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 1029 days.

(21) Appl. No.: 11/772,347

(22) Filed: Jul. 2, 2007

(65) Prior Publication Data

US 2009/0013231 A1   Jan. 8, 2009

(51) Int. Cl.
*G11C 29/00* (2006.01)
(52) U.S. Cl. ............... 714/763; 365/185.03; 365/185.09
(58) Field of Classification Search .................. 714/763; 365/185.03, 185.09
See application file for complete search history.

(56) References Cited

U.S. PATENT DOCUMENTS

| | | | | |
|---|---|---|---|---|
| 5,394,362 A | * | 2/1995 | Banks | 365/185.03 |
| 5,550,849 A | * | 8/1996 | Harrington | 714/752 |
| 5,621,682 A | * | 4/1997 | Tanzawa et al. | 365/185.03 |
| 7,561,465 B2 | * | 7/2009 | Hancock et al. | 365/185.09 |
| 7,809,994 B2 | * | 10/2010 | Gorobets | 714/52 |

* cited by examiner

*Primary Examiner* — Esaw T Abraham
(74) *Attorney, Agent, or Firm* — Ido Tuchman; Vazken Alexanian

(57) ABSTRACT

A method, system, and computer software product for operating a memory cell collection. Memory cells in the collection store binary multi-bit values delimited by characteristic parameter bands of a characteristic parameter. In one embodiment, a comparing unit compares a retrieved count and a stored count for each binary multi-bit value. The retrieved count, equal to the number of occurrences the binary multi-bit value, is retrieved from the memory cell collection. The stored count, equal to the number of occurrences the binary multi-bit value, is stored in the memory cell collection. An error correction unit then assigns the error memory cell(s) a corrected binary multi-bit value with the characteristic parameter value within the characteristic parameter band adjacent to the characteristic parameter band associated with the retrieved binary multi-bit value such that the retrieved count of each binary multi-bit value is equal to the stored count of each binary multi-bit value.

20 Claims, 8 Drawing Sheets

| Characteristic Parameter Band | Stored Cell Count | Binary Values | Count Cell Data ||| Total Cell Count |
|---|---|---|---|---|---|---|
| | | | Cell 1 | Cell 2 | Cell 3 | |
| Band 0 | 256 | 000 | 100 | 000 | 000 | 282 |
| Band 1 | 256 | 001 | 100 | 000 | 000 | 256 |
| Band 2 | 256 | 010 | 100 | 000 | 000 | 256 |
| Band 3 | 256 | 011 | 100 | 000 | 000 | 256 |
| Band 4 | 256 | 100 | 100 | 000 | 000 | 264 |
| Band 5 | 256 | 101 | 100 | 000 | 000 | 256 |
| Band 6 | 256 | 110 | 100 | 000 | 000 | 256 |
| Band 7 | 256 | 111 | 100 | 000 | 000 | 256 |

FIG. 4

MULTI-BIT ERROR CORRECTION SCHEME IN MULTI-LEVEL MEMORY STORAGE SYSTEM

CROSS-REFERENCE TO RELATED APPLICATIONS

This application contains subject matter which is related to the subject matter of the following application, which is assigned to the same assignee as this application, International Business Machines Corporation of Armonk, New York. The below listed application is hereby incorporated herein by reference in its entirety:

U.S. patent application Ser. No. 11/620,704 filed Jan. 7, 2007, titled "MAXIMUM LIKELIHOOD STATISTICAL METHOD OF OPERATIONS FOR MULTI-BIT SEMICONDUCTOR MEMORY" issued as U.S. Pat. No. 7,480,184 on Jan. 20, 2009.

BACKGROUND OF THE INVENTION

1. Field of the Invention

The present invention relates to operation of memory storage systems, and more particularly to error detection and correction in memory storage systems using statistical methods and data cell counts in high density storage systems.

2. Description of Background

Typical semiconductor computer memories are fabricated on semiconductor substrates consisting of arrays of large number of physical memory cells. In general, one bit of binary data is represented as a variation of a physical parameter associated with a memory cell. Commonly used physical parameters include threshold voltage variation of the Metal Oxide Field Effect Transistor (MOSFET) due to the amount of charge stored in a floating gate or a trap layer in non-volatile Electrically Erasable Programmable Read Only Memory (EEPROM), resistance variation of the Phase Change memory element in Phase-change Random Access Memory (PRAM) or Ovonic Unified Memory (OUM), and charge storage variation in volatile Dynamic Random Access Memory (DRAM).

Increasing the number of bits to be stored in a single physical semiconductor memory cell is an effective method to lower the manufacturing cost per bit. Multiple bits of data can also be stored in a single memory cell when variations of the physical parameter can be associated with multiple bit values. This multiple bits storage memory cell is commonly known as Multi-Level Cell (MLC). Significant amount of efforts in computer memory device and circuit designs are devoted to maximize the number of bits to be stored in a single physical memory cell. This is particularly true with storage class memory such as popular non-volatile Flash memories commonly used as mass storage device.

The basic requirement for multiple bit storage in a semiconductor memory cell is to have the spectrum of the physical parameter variation to accommodate multiple non-overlapping bands of values. The number of bands required for an n-bit cell is $2^n$. A 2-bit cell needs 4 bands, a 3-bit cell needs 8 bands and so forth. Thus, the available spectrum of a physical parameter in a semiconductor memory cell is the limiting factor for multiple bit memory storage.

In addition to the limiting spectrum width, fluctuations in environmental variables such as temperature, power, and time affect all operations and data integrity of a typical semiconductor storage device. Data integrity is a major problem for data storage systems due to the fluctuations in the environment variables. It is desirable to devise a cost effective method to preserve the integrity of the stored data in semiconductor storage systems.

SUMMARY OF THE INVENTION

An exemplary embodiment of the present invention is a method for operating a memory cell collection. The memory cell collection contains a plurality of memory cells. Each of the memory cells in the memory cell collection stores a binary multi-bit value delimited by characteristic parameter bands of a characteristic parameter. Additionally, the characteristic parameter shifts over time.

The method for memory controller operation entails dividing a characteristic parameter in the memory cell collection into a plurality of characteristic parameter bands. A binary multi-bit value is assigned to each of the plurality of characteristic parameter bands. A converting operation converts the binary multi-bit values to characteristic parameter values. The characteristic parameter values are in the characteristic parameter band associated with the assigned binary multi-bit values corresponding to the binary multi-bit values. A storing operation stores the binary multi-bit values in the memory cell collection as the characteristic parameter values. Another storing operation stores a stored count for each binary multi-bit value. The stored count is equal to the number of occurrences the binary multi-bit value is stored in the memory cell collection.

At a later time, a converting operation converts the stored characteristic parameter values to retrieved binary multi-bit values according to the assigned binary multi-bit values. A determining operation determines a retrieved count for each binary multi-bit value. The retrieved count is equal to the number of occurrences the binary multi-bit value is retrieved from the memory cell collection. If the stored count of each binary multi-bit value is not equal to the retrieved count of each binary multi-bit value, the method further includes a calculating operation, an identifying operation, and an assigning operation. The calculating operation calculates a band probability that the stored characteristic parameter value belongs to the characteristic parameter band assigned to the binary multi-bit value. The identifying operation identifies at least one error memory cell in the memory cell collection with a low band probability. The assigning operation assigns the error memory cell a corrected binary multi-bit value with the characteristic parameter value within the characteristic parameter band adjacent to the characteristic parameter band associated with the retrieved binary multi-bit value such that the retrieved count is equal to the stored count for each binary multi-bit value.

Another exemplary embodiment of the invention is a memory device. The memory device includes memory cells organized into memory cell collections comprised of a plurality of memory cells. Each of the memory cells in the memory cell collection stores a binary multi-bit value delimited by characteristic parameter bands of a characteristic parameter.

A receiving unit in the memory device is configured to receive stored characteristic parameter values for each memory cell in the memory cell collection. A sensing unit is configured to sense shifted values in the characteristic parameter for each memory cell in the memory cell collection. A generating unit is configured to generate a probability distribution function of the characteristic parameter values for each of the stored binary multi-bit values from the shifted values of characteristic parameter for each memory cell in the memory cell collection. A probability determining unit is configured to determine a band probability that the stored characteristic parameter values from the memory cell collection are within the probability distribution function for each of the stored binary multi-bit values. A converting unit is configured to convert the stored characteristic parameter values from the memory cell collection into the retrieved binary multi-bit values for which the probability is highest. A stored count determining unit is configured to determine a stored count for each binary multi-bit value stored in the memory cell collection. The stored count is the number of occurrences each binary multi-bit value is stored in the memory cell collection. A retrieved count determining unit is configured to determine a retrieved count for each binary multi-bit value retrieved from the memory cell collection. The retrieved count is the number of occurrences each binary multi-bit value is retrieved from the memory cell collection. A comparing unit is configured to compare the stored count of each binary multi-bit value with the retrieved count of each binary multi-bit value. If the retrieved count of each binary multi-bit value is not equal to the stored count of each binary multi-bit value, an error correcting unit is configured to receive the band probability that the stored characteristic parameter value belongs to the characteristic parameter band assigned to the binary multi-bit value for each memory cell in the memory cell collection. Furthermore, the error correction unit is configured to identify at least one error memory cell with a low band probability. The error memory cell corresponds to at least one of the memory cells in the memory cell collection. The error correction unit is also configured to assign the error memory cell a corrected binary multi-bit value with a characteristic parameter value within the characteristic parameter band adjacent to the characteristic parameter band associated with the retrieved binary multi-bit value such that the retrieved count of each binary multi-bit value is equal to the stored count of each binary multi-bit value.

Yet another exemplary embodiment of the invention is a computer program comprising a tangible computer readable medium embodying computer program code for operating at least one memory cell collection. The memory cell collection is comprised of a plurality of memory cells. Each of the memory cells in the group of memory cells stores a binary multi-bit value delimited by characteristic parameter bands of a characteristic parameter.

The computer program contains computer executable instructions configured to store a stored count for each binary multi-bit value. The stored count is equal to the number of occurrences the binary multi-bit value is stored in the memory cell collection. The computer executable instructions are configured to convert the stored characteristic parameter values to retrieved binary multi-bit values according to the assigned binary multi-bit values. The computer executable instructions are also configured to determine a retrieved count for each binary multi-bit value; the retrieved count is equal to the number of occurrences the binary multi-bit value is retrieved from the memory cell collection. If the stored count of each binary multi-bit value is not equal to the retrieved count of each binary multi-bit value, the computer executable instructions are further configured to calculate a band probability that the stored characteristic parameter value belongs to the characteristic parameter band assigned to the binary multi-bit value for each memory cell in the memory cell collection. The computer executable instructions are also configured to identify at least one error memory cell in the memory cell collection with a low band probability. Furthermore, the computer executable instructions are configured to assign the error memory cell a corrected binary multi-bit value with the characteristic parameter value within the characteristic parameter band adjacent to the characteristic parameter band associated with the retrieved binary multi-bit value such that the retrieved count of each binary multi-bit value is equal to the stored count of each binary multi-bit value.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 4 illustrates a method for stored counts in accordance with one embodiment of the present invention.

Figure 1:
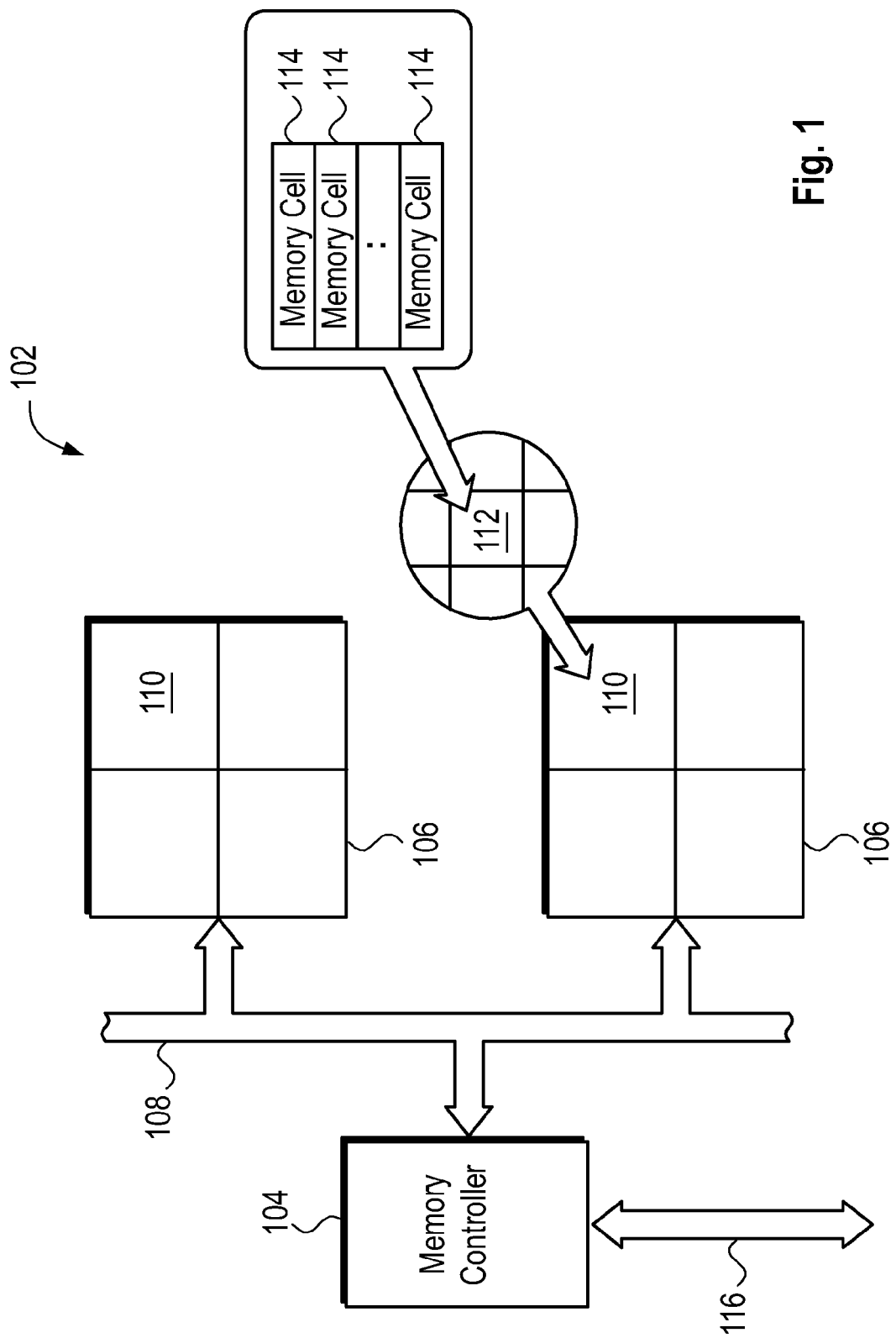
FIG. 1 illustrates a particular embodiment of a memory system in accordance with the present invention.

The detailed description explains the preferred embodiments of the invention, together with advantages and features, by way of example with reference to the drawings.

DETAILED DESCRIPTION OF THE INVENTION

The present invention will be described with reference to FIG. 1-7. When referring to the figures, like elements shown throughout are indicated with like reference numerals.

FIG. 1 illustrates an exemplary embodiment for a memory cell system 102 is illustrated. The system includes a memory controller 104 coupled to one or more memory units 106 via a memory bus 108.

The memory units 106 may be individually packaged memory chips or the memory units 106 may exist in a single package multiplexed together. Furthermore, the memory controller 104 may be separately packed or incorporated with the memory units 106.

The memory units 106 are not limited to a particular memory storage technology. Those skilled in the art will recognize that different memory technologies use different characteristic parameters to store data. For example, Random Access Memory (DRAM) technology uses charge storage variation as a characteristic parameter to retain binary data. Phase Change Memory (PCM) and Resistive Random Access Memory (RRAM) technology use resistance variation as a characteristic parameter to store binary data. The memory cell system 102 only needs to be bound to a common adjustable characteristic parameter for all memory cells 114.

As shown, each memory unit 106 is divided into a plurality of memory cell collections 110. Each memory cell collection 110 is comprised of multiple groups of memory cells 112. Each group of memory cells 112 contains a plurality of memory cells 114. Moreover, each individual memory cell 114 contains at least one possible binary value by associating the binary values with a characteristic parameter band in the memory cell. The characteristic parameter bands are delimited by preset value ranges of a characteristic parameter during a store operation 208 to be further described in FIG. 2. For proper performance of the present error detection and correction scheme, the memory cells 114 within a memory cell collection 110 are physically located in proximity with each other, are written and read at about the same time, and therefore undergo similar characteristic parameter perturbation and deterioration.

In one embodiment, the memory controller 104 receives a command and the corresponding data from the central processing unit (CPU) through an instruction/data bus 118 to program a memory cell collection 110.

Figure 2:
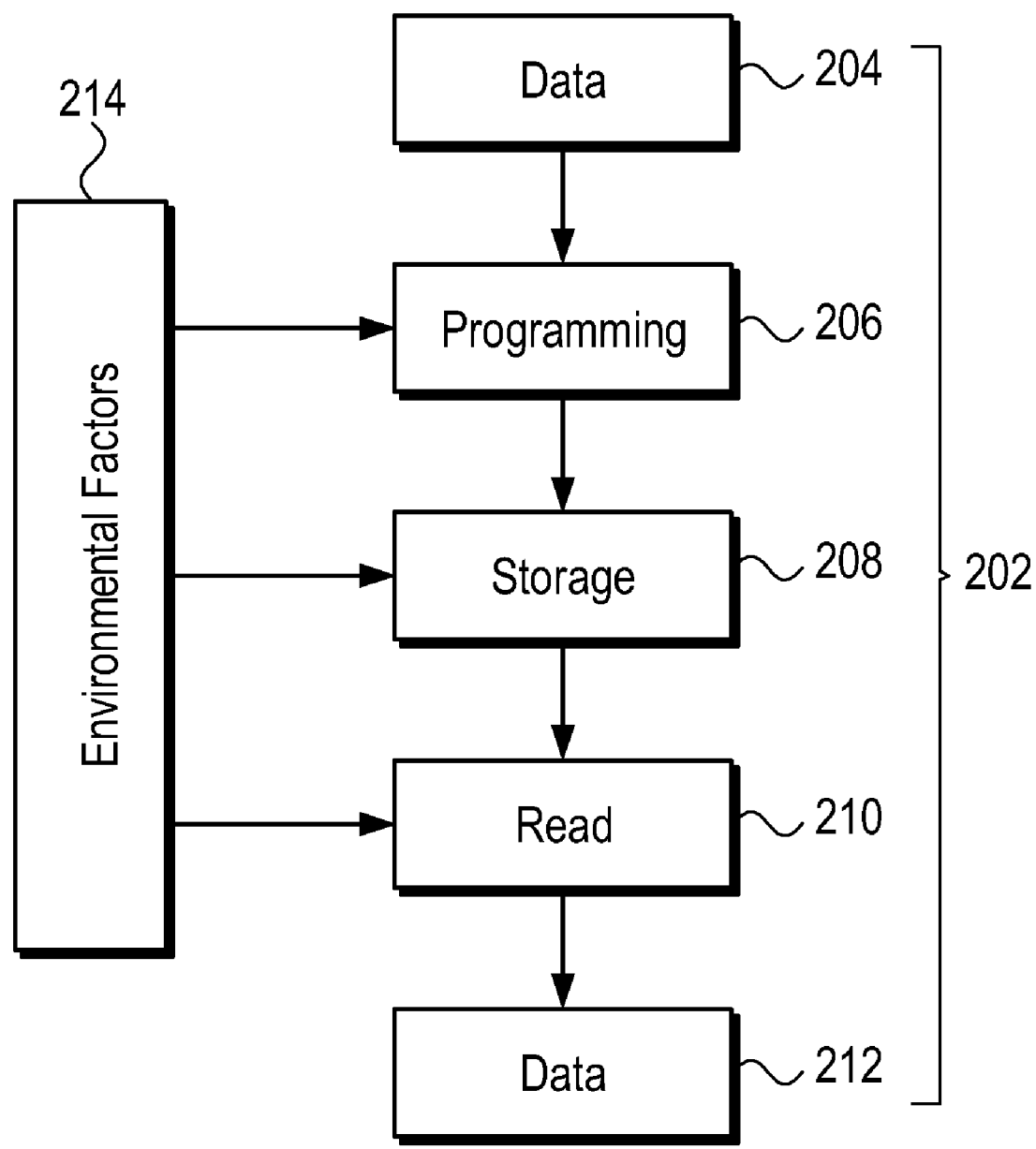
FIG. 2 illustrates the environmental effects on memory system operations.

Turning to FIG. 2, a memory cell operation procedure 202 according to the present invention is shown. At step 204, data to be stored is acquired. The data may come from various sources, such as a Central Processing Unit (CPU) or a peripheral device coupled to the memory unit containing the memory cell.

At programming operation 206, the acquired data is written into the memory cell. Depending on the storage technology used, writing data may consist of storing charge in a capacitor for charge storage, applying voltage to the source, drain, or control gate in a floating gate transistor for threshold voltage variation, melting and cooling the phase change material to change optical refractive index, or melting and cooling phase change material to change resistance. After the data is written into memory, it is stored for a period of time at storing operation 208.

At a later time after the storing operation 208, the data is retrieved from the memory cell during reading operation 210. The exact process for retrieving the data again depends on the technology used. For example, when reading DRAM memory, transistors are activated connecting the memory cell capacitors to sense lines. When reading a PCM memory cell, a current is passed through the cell's phase-change material. The data is finally retrieved at step 212.

The environment 214 (both internal and external to the memory cell) affects the programming 206, storing 208, and reading 210 operations of the memory cell operation procedure 202. Environmental factors such as, but not limited to, humidity, time, temperature, magnetic fields, and electrical fields may cause for example charge leakage in DRAM, threshold voltage shifts in EEPROM, optical refractive index variation in phase change material of optical memory, or change the resistance levels in PCM and RRAM. More generally, the characteristic parameter used to delineate binary values in the memory cell may shift over time due to environmental conditions. The environmental factors 214 cause data distortion so that the data extracted from the memory cell may not be the same as the data input to the memory cell. As discussed below, an embodiment of the present invention is an operating procedure that compensates for shifts in the characteristic parameter over time using error detection and correction methods with statistical operations and data cell counts.

Figure 3:
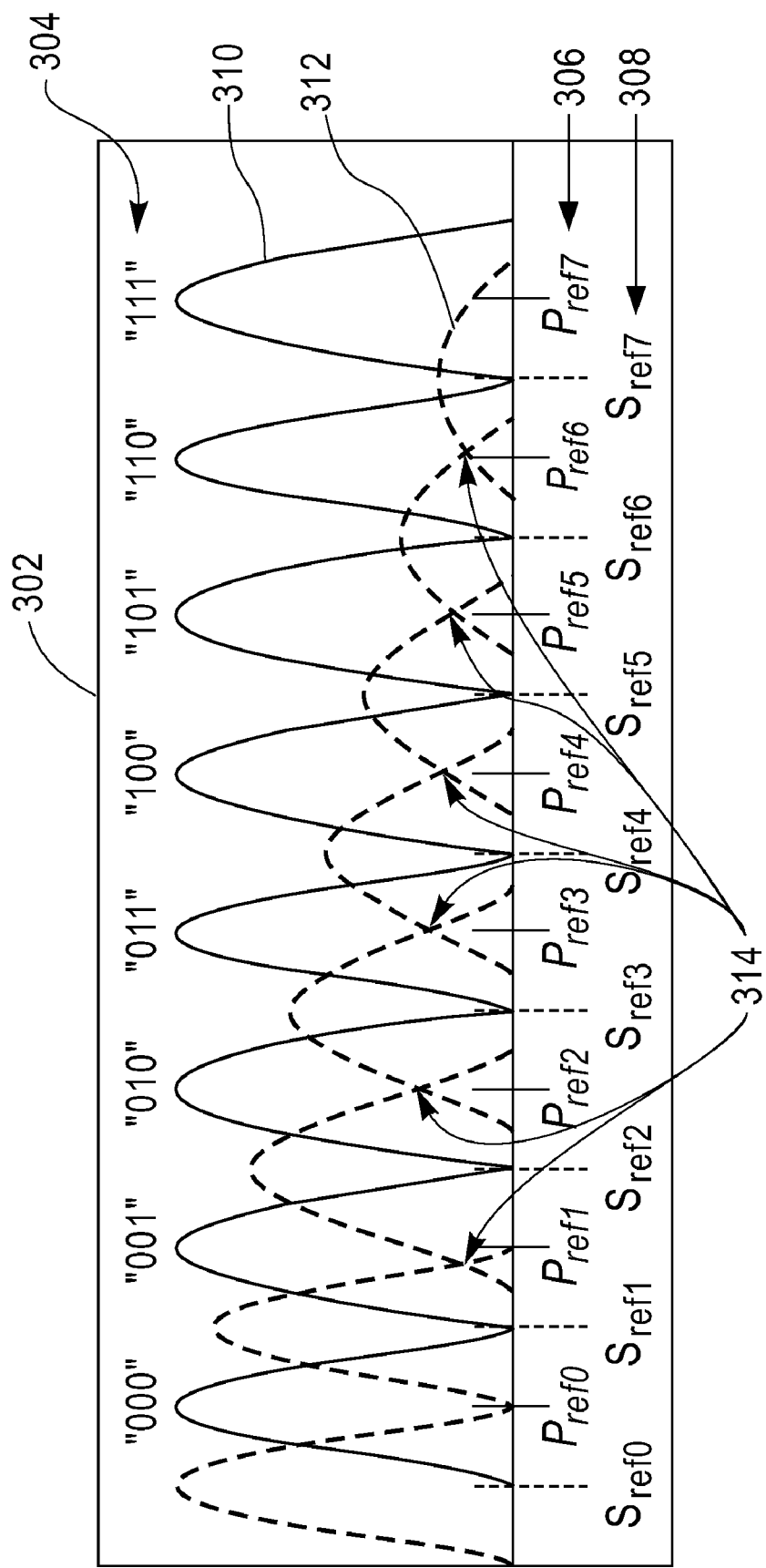
FIG. 3 illustrates a characteristic parameter distribution in an exemplary memory cell collection of the present invention.

FIG. 3 shows a memory cell collection distribution 302 for a 3-bit binary data embodiment. A characteristic parameter in each memory cell is divided into a plurality of characteristic parameter bands 310. As illustrated, each binary multi-bit value 304 is assigned to a characteristic parameter band 310. The characteristic parameter bands 310 are centered on a preset characteristic parameter reference value 306 (e.g., designated as parameters $P_{ref0}$-$P_{ref7}$). When programming a memory cell to store a binary multi-bit value, the characteristic parameter value for the memory cell is programmed to the preset characteristic parameter reference value 306.

Ideally, binary multi-bit values 304 stored in a memory cell collection are represented by precise characteristic parameter values exactly equaling the preset characteristic parameter reference values 306. In practice, however, the characteristic parameter values form bands (typically Gaussian distribution curves) centered about the preset characteristic parameter reference values 306. This is typically due to natural variations during memory cell manufacturing. Thus, the preset characteristic parameter reference values 306 ($P_{ref0}$-$P_{ref7}$) are mean values of the characteristic parameter when data is initially programmed in a memory cell collection. Furthermore, the characteristic parameter values shift as a result of environmental factors over time, as discussed above. Without loss of generality, the number of memory cells in each initial characteristic parameter band 310 is assumed to be the same here; however, in practice, the numbers of memory cells may vary.

FIG. 3 also illustrates the shifting of characteristic parameter values as a result of environmental factors in the form of the characteristic parameter bands that the values form. As illustrated shifted characteristic parameter bands 312 are no longer centered on the preset characteristic parameter reference values 306 but centered on shifted characteristic parameter reference values 308 (e.g., designated as parameters $S_{ref0}$-$S_{ref7}$). The characteristic parameter values are shifted towards the left from the initial characteristic parameter bands 310 which represent a lower potential energy configuration of the memory cell parameter within the storage or operating environment. In general, the shift is more pronounced and the dispersion is wider farther away from the lowest potential energy configuration. For example, the characteristic parameter in FIG. 3 may represent the apparent threshold voltages of a memory cell collection of Flash EEPROM in which the apparent threshold voltage is an increasing function of the number of electrons stored in the floating gate, and the lowest potential energy configuration is no electron stored corresponding to lowest apparent threshold voltage.

The memory controller beneficially compensates for decays in characteristic parameter values by not only reading the characteristic parameter value of a target memory cell in the memory cell collection, but also of the characteristic parameter values of all the memory cells in the memory cell collection. In the data retrieval operation, the memory controller receives a high precision characteristic parameter value for each memory cell in the memory cell collection and fits the dispersed and shifted characteristic parameter bands with probable distribution curves by statistical methods.

The characteristic parameter value of a target memory cell is evaluated against the shifted characteristic parameter bands 312 constructed and the most likely binary multi-bit value for the target memory cell is determined by choosing the band with the highest probability value. Any memory cell in the memory cell collection can be a target memory cell. In this manner, the binary multi-bit values of all the memory cells in the memory cell collection can be retrieved. In one embodiment of the invention, the shifted characteristic parameter bands 312 of the memory cell collection are reconstructed each time the target memory cell or a group of memory cells or the entire memory cell collection is read. Memory cell data may be rewritten or restored after a threshold time interval and/or when a memory cell is programmed or reprogrammed.

In one embodiment, the characteristic parameter bands are created by a probability distribution function, $$P(x_1^k, \ldots, x_{n_k}^k \mid \mu_k, \sigma_k^2) = \left(\frac{1}{2\pi\sigma_k^2}\right)^{\frac{n_k}{2}} e^{-\frac{\sum_{i=1}^{n_k}(x_i^k - \overline{x^k})^2 + n_k(\overline{x^k} - \mu_k)^2}{2\sigma_k^2}}$$

where $n_k$ is the number of memory cells with a characteristic parameter in the kth band, m is the number of bit storage values per memory cell, and $x^k$ is the value of the characteristic parameter value read from a memory cell pertaining to a specific band, not x to the kth power; so, $x_1^1$ would indicate the first characteristic parameter from the first characteristic parameter band in the memory cell collection. The number of bands (k) and the mean of the characteristic parameter values read ($\overline{x^k}$) are defined by, $$k = 1, \ldots, 2^m, \overline{x^k} = \frac{1}{n_k}\sum_{i=1}^{n_k} x_i^k.$$

Additionally, $\mu_k$ is the mean of the kth band, also used as the reference points $P_{ref}$ and $\sigma_k^2$ is the variance of the kth band. A maximum likelihood estimator is given by, $$\hat{\theta}_k = (\hat{\mu}_k, \hat{\sigma}_k^2) = \left(\overline{x^k}, \sum_{i=1}^{n_k}(x_i^k - \overline{x^k})^2 / n_k\right)$$

where $\hat{\mu}_k$ is the mean estimator of the kth band and $\hat{\sigma}_k^2$ is the variance estimator of the kth band. The maximum likelihood estimator is used to determine the band to which a particular value belongs, and in turn the binary data a memory cell stores, by using a least squares method. A sensed value from the memory cell is placed in each individual band of the memory cell collection and a probability is assigned to each band based on the value and its relation to the mean of the band. A problem in constructing shifted distribution bands arises if each individual memory cell is programmed separately. The shifts of each characteristic parameter will vary since each memory cell may be exposed to environmental factors over different durations of time between programming. For example, in EEPROM, the electrons stored in the floating gate may leak over time and with heat. Memory cells programmed at differing times will have differing amounts of electron leakage depending on the how long they have been exposed to heat since their initial programming. Furthermore, the characteristic parameter bands will differ greatly from memory cell collection to memory cell collection.

If the cells are programmed all at the same time whether or not certain data needs to be changed creates a consistent data shift. This prevents the aforementioned problem with varying degrees of shift because electron leakage is consistent across a memory cell collection. New distribution bands can now be created with consistently shifted data using the probability distribution function and the maximum likelihood estimator.

Since time, heat, and other environmental factors shift characteristic parameter values and their bands, over a period of time the value ranges may shift enough so that they may become one continuous band. Referring again to FIG. 3, for example, the shifted characteristic parameter bands 312 corresponding to binary data "011" and "100" begin to overlap at point 314. A maximum likelihood estimator can be used to generate a good estimate for values located in an overlapping region, but as overlap increases the accuracy of the maximum likelihood estimator also decreases. To help overcome this uncertainty in maximum likelihood estimation, an error correction scheme is utilized, as detailed below.

FIG. 4 illustrates an exemplary embodiment of the invention using 3-bit binary storage values with increasing assigned binary multi-bit values 406 associated with increasing characteristic parameter bands. For each characteristic parameter band 402 a stored cell count 404 is calculated. For the sake of simplicity in this example, all characteristic parameter bands 402 will have an equal number of data cells storing their assigned binary multi-bit values 406. In this exemplary embodiment the stored cell count 404 for each characteristic parameter band 402 is stored in 3 count cells containing count cell data 408. The stored cell count 404 equals "256" for each characteristic parameter band in this example. This is represented by the count cell data 408 as "100", "000", and "000". Since the 3 count cells also contain binary multi-bit data, a total cell count 410 for each characteristic parameter band 402 is the sum of the stored cell count 404 for the band and the data stored in the 3 count cells. The binary data stored in the count cells is not protected by the counting method of error detection and correction. However, a method for cell count protection will be detailed below.

The stored cell count 404 in this exemplary embodiment is stored in count cells in the memory cell collection, storing the data as binary multi-bit values in a similar fashion to the memory cells. The stored cell count 404 in separate embodiments may be stored in cells located in but not limited to the memory controller or an external memory device.

Figure 5A:
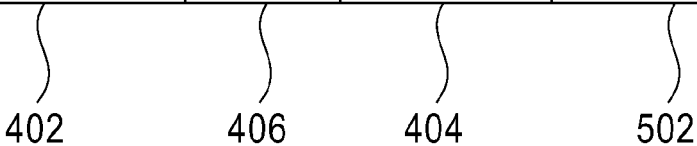
FIGS. 5A and 5B illustrates error detection operations with stored count and retrieved count comparison, and band probability in accordance with one embodiment of the present invention.

The binary multi-bit values retrieved from a group of memory cells or a memory cell collection may also shift and produce erroneous data as a result of the characteristic parameter value shifts. FIG. 5A illustrates the stored cell count 404 and a retrieved cell count 502 retrieved from the memory cell collection. The stored cell count 404 and the retrieved cell count 502 for the memory cell collection are not equal. The stored cell count 404 for Band 7 is "256" but the retrieved cell count 502 for Band 7 is "255". This indicates that one memory cell in the memory cell collection has binary multi-bit values that have shifted. The memory controller checks the difference between the stored cell count 404 and the retrieved cell count 502 from the neighboring characteristic parameter band 402. As illustrated, Band 6's stored cell count 404 equals "256" and the retrieved cell count 502 is "257". Thus, one memory cell's binary multi-bit value has shifted from "111" to "110". One should also note that a decrease in cell counts in one characteristic parameter band 402 should result in the increase in cell counts in the neighboring characteristic parameter band 402 with lower potential energy under normal circumstances. However, under special circumstances, the characteristic parameter value for a memory cell may increase in potential energy and it will shift the value up characteristic parameter bands 402 and the count will increase in the neighboring characteristic parameter band 402 with greater potential energy. The differences between the retrieved cell count 502 and stored cell count 404 should be treated the same in error detection.

Figure 5B:
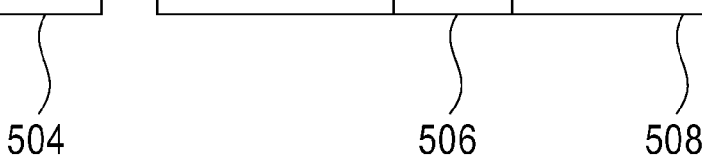

FIG. 5B shows stored data 504 and retrieved data 506 from the group of memory cells in the memory cell collection in this example. A band probability 508 is calculated for each memory cell by the statistical methods mentioned above. The band probability 508 indicates the likeliness that the retrieved data 506 is the stored data 504 in each memory cell during the programming operation. As shown in FIG. 5B, the retrieved data 506 for Data Cell 2 equaling "110" has the lowest band probability 508 which indicates that the likelihood of the retrieved data 506 of being correct is the lowest. Thus Data Cell 2 is the most probable error memory cell. This is shown by the stored data 504 in Data Cell 2 equaling "111" and verified by the shift between "111" and "110" in FIG. 5A. Note that any assignment scheme may be used when assigning binary multi-bit values 304 to characteristic parameter bands 310.

The difference between retrieved cell counts 502 and stored cell counts 404 for each characteristic parameter band 402 must equal the difference between the retrieved cell count 502 and stored cell count 404 of the neighboring characteristic parameter band 402. If the differences between the retrieved cell counts 502 and the stored cell counts 404 are not equal either a multi-band shift of data has occurred or the stored cell counts 404 are incorrect. A multi-band data shift is detectable from the inequality but not correctable and an error indication must be transmitted.

In an embodiment of the invention, stored cell counts 404 are also binary multi-bit values stored in memory cells in the memory cell collection. This means the data stored in the cells are also susceptible to the same environmental factors that cause data shifts. In order to eliminate errors in retrieved cell count 502 data used for error correction at least one redundant stored cell count is used. The stored cell count 404 and the redundant stored cell count can be check against each other to verify the stored cell count 404 data. If only one redundant stored cell count is used an error indication must be transmitted as the error is detected but cannot be corrected. If more than one redundant stored cell count is used a vote can be taken to calculate the most probable stored cell count 404 values.

Figure 6A:
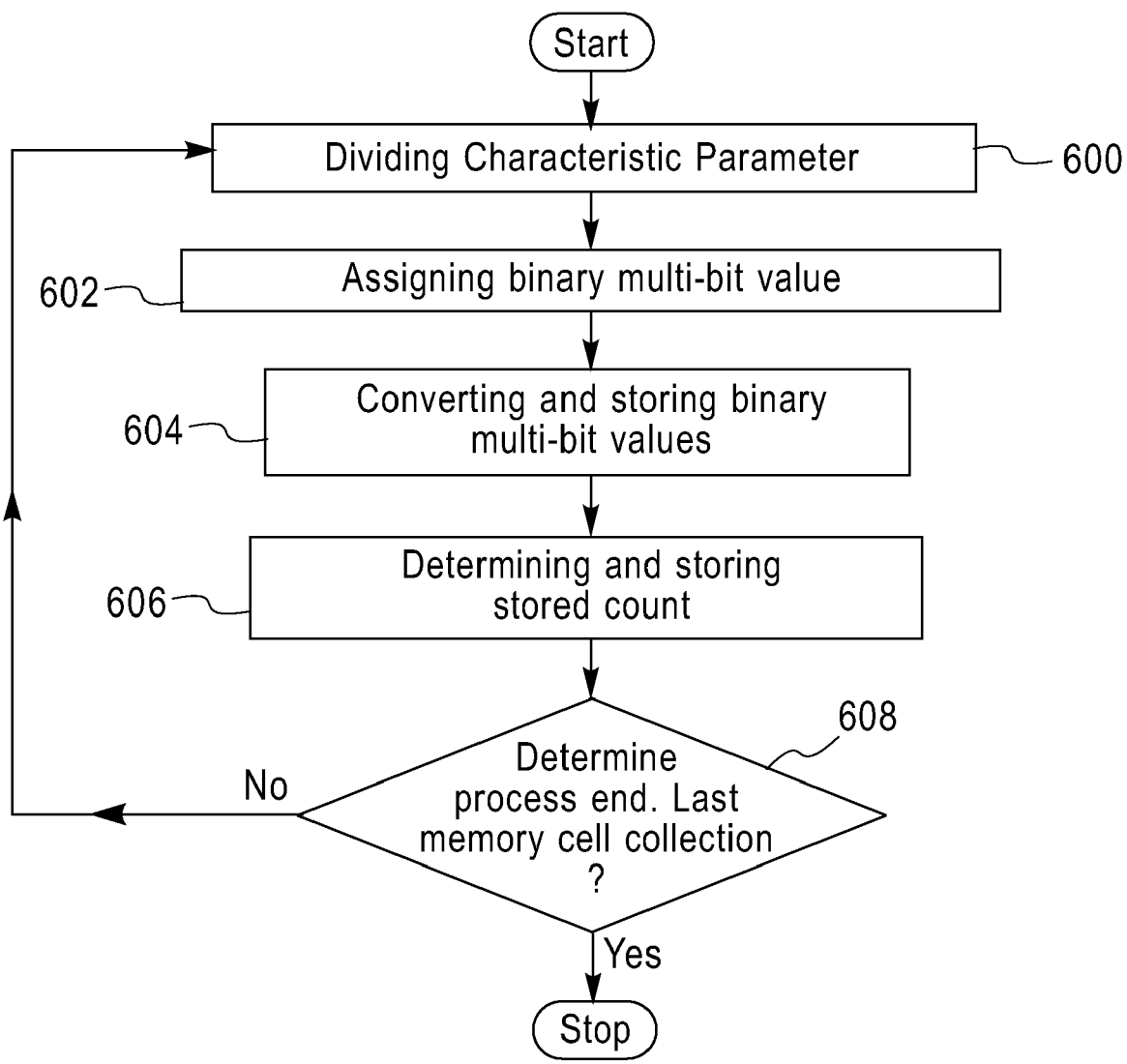
FIG. 6 illustrates error detection and correction operation flow according to one embodiment of the present invention.
Figure 6B:
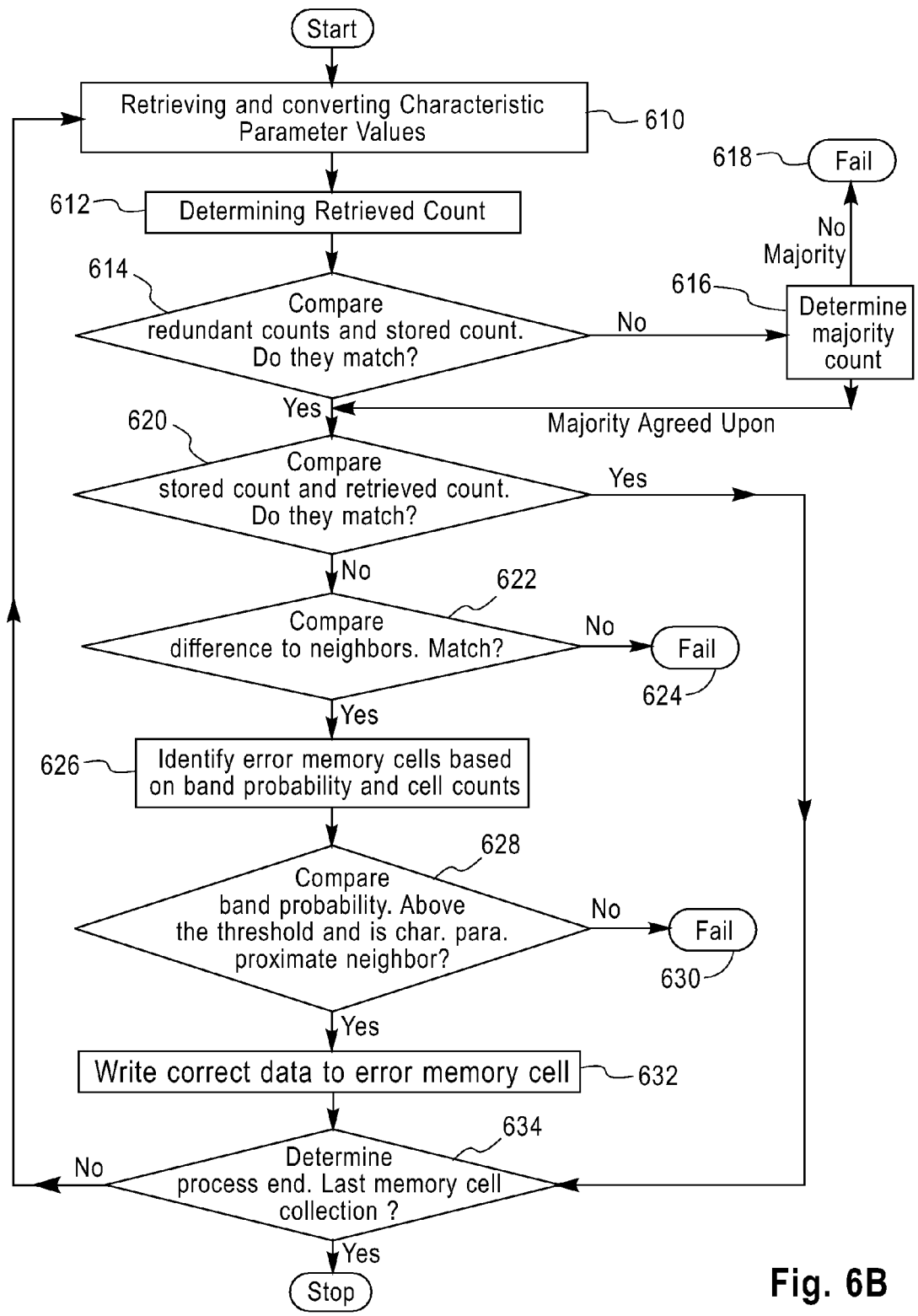

Now turning to FIGS. 6A and 6B, an error detection and correction flowchart in accordance with an embodiment of the present invention is shown. It will be understood that each block of the flowchart, and combinations of blocks in the flowchart, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

As will be appreciated by one skilled in the art, the present invention may be embodied as a method, system, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device or a magnetic storage device.

FIG. 6A illustrates storage operations in an embodiment of the invention. The process flow beings at dividing operation 600. During the dividing operation 600, a characteristic parameter in each memory cell of a memory cell collection is divided into characteristic parameter bands. As mentioned above, the present invention is not limited to a particular memory storage technology and various characteristic parameters may be used to store data in accordance with the invention. The number of divisions of the characteristic parameter depends on the number of bits each memory cell is programmed to store. A binary multi-bit system generally requires $2^k$ characteristic parameter bands, where k is the number of bits each memory cell is programmed to store. After the characteristic parameter has been divided into the characteristic parameter bands the control moves to assigning operation 602.

At assigning operation 602, each binary multi-bit value the memory cells in the memory cell collection may store is assigned to the characteristic parameter bands. As shown back in FIG. 3, a linear binary assignment scheme may be used; however, other assignment schemes, such as Grey code, may be used in accordance with the invention. After assigning operation 602 is completed, control passes to converting operation 604.

At converting operation 604, the binary multi-bit values that require storage are converted to the characteristic parameter values that are within the characteristic parameter bands the binary multi-bit values are assigned to. The values are then stored to the memory cell collection. As mentioned above, all the memory cells in the memory cell collection should be programmed at the same time to reduce characteristic parameter shift variations from memory cell to memory cell. After converting operation 604, control passes to determining operation 606.

At determining operation 606, a stored count is determined for each binary multi-bit value and stored in the memory cell collection. The stored count being equal to the number of occurrences the binary multi-bit value is stored in the memory cell collection. In one particular embodiment, the stored count is stored in memory cells in the memory cell collection designated to store the count data as binary multi-bit values. These count cells do not count themselves and are therefore not protected by the error detection and correction process. However, redundant counts cell can be utilized for the stored count to help ensure stored count integrity. Additionally, the stored count may be stored in a particular memory buffer coupled to the memory controller or in an external memory device. After determining operation 606 is complete, control moves to determining operation 608.

At determining operation 608, a determination is made as to whether there are additional memory cell collections that require error detection and correction. If there are more memory cell collections that require storage operations the system moves to the next memory cell collection and the control flow passes back to dividing operation 600. If the memory cell collection is the last or only memory cell collection that requires storage operations the process ends.

FIG. 6B illustrates the retrieval, error detection, and error correction operations in one embodiment of the invention. As illustrated, the process begins at retrieving operation 610. During retrieving operation 610, the characteristic parameter values representing binary multi-bit values are retrieved from the memory cell collection. Once the characteristic parameter values have been retrieved the characteristic parameter values are converted to the binary multi-bit values they represent. In one embodiment of the invention, an analog sense amplifier and analog-to-digital converter circuit perform retrieving operation 610.

In a particular embodiment of the invention, converting the characteristic parameter values to binary multi-bit values includes sensing shifted values of the characteristic parameter for each memory cell in the memory cell collection. A probability distribution function is then generated for each of the possible binary multi-bit values from the shifted values of the characteristic parameter for each memory cell. A probability that the stored characteristic parameter values from the memory cell collection are within the probability distribution function is determined for each of the possible binary multi-bit values. Furthermore, the stored characteristic parameter values from the memory cell collection are converted into retrieved binary multi-bit values for which the probability is highest. After retrieving operation 610 is completed, process flow passes to determining operation 612.

At determining operation 612, a retrieved count is determined for each binary multi-bit value. The retrieved count is equal to the number of occurrences each binary multi-bit value is retrieved from the memory cell collection. After the retrieved count has been determined, control passes to comparing operation 614.

At comparing operation 614, the stored count for each binary multi-bit value and redundant counts for each binary multi-bit value are compared. If the stored count and redundant counts match the process moves control to comparing operation 620. If the stored count and redundant counts do not match the process moves control to determining operation 616.

At determining operation 616, a majority count is determined. If there is no majority that can be agreed upon the process fails to error operation 618. At error operation 618, an error indication is transmitted indicating stored count failure. If there is a majority count that can be agreed upon, control passes to comparing operation 620. Note that there may be several possible reasons for the process to fail to error operation 618. If there is only one redundant count made and the stored count and redundant count do not match a majority cannot be determined. Another possibility, even with a plurality of redundant counts, is that multiple differing counts may be retrieved and no majority may be determined from the multiple differing counts.

At comparing operation 620, the stored count is compared to the retrieved count. The stored count used by comparing operation 620 is either the exact stored count retrieved or the majority agreed upon count from the stored count and redundant counts. If the stored count for each binary multi-bit value and the retrieved count for each binary multi-bit value match, control passes to determining operation 634. If the stored count for each binary multi-bit value and the retrieved count of each binary multi-bit value do not match, control passes to comparing operation 622.

At the comparing operation 622, the difference between the stored count and retrieved count for each binary multi-bit value is compared to the binary multi-bit value assigned to the neighboring characteristic parameter band. If there is no difference between the stored count and the retrieved count of the binary multi-bit value, control passes to determining operation 634. However, if there is a difference between the stored count and the retrieved count of the binary multi-bit value the difference should match the difference between the stored count and retrieved count for one of the binary multi-bit values in the neighboring characteristic parameter bands. For example, if the stored count is five greater than the retrieved count for the binary multi-bit value (indicating 5 possible error memory cells) the stored count should be five less than the retrieved count for one of the binary multi-bit values assigned to the neighboring characteristic parameter bands. If the difference between the stored count and the retrieved count match one of the neighboring differences, process flow continues to identifying operation 626. If there is no neighboring count difference matching the retrieved count, the process fails to error operation 624. At error operation 624 an error indication is transmitted.

At identifying operation 626, a band probability that the stored characteristic parameter value belongs to the characteristic parameter band assigned to the binary multi-bit value is calculated for each memory cell in the memory cell collection. The band probability for each memory cell is evaluated using statistical methods, as discussed above. The identifying operation 626 further identifies at least one error memory cell having a low band probability belonging to the memory cell collection. In a particular embodiment of the invention, the band probability of the error memory cell is compared against a probability threshold value such that a memory cell having the band probability above the probability threshold value is not considered an error memory cell. After identifying operation 626 is completed, control passes to comparing operation 628.

At comparing operation 628, the band probability of the error memory cell is compared against a probability threshold value. If the band probability of the error memory cell is not lower than a threshold value, an error indication is sent at error operation 630. The comparing operation 628 also looks for a closest or proximate neighboring band that is the most probable neighboring band to which the error memory cell would belong. In particular, the operation checks if there is a binary multi-bit value in a band adjacent to the current characteristic parameter band of the error memory cell that would account for the differences between the stored count and retrieved count. If the error memory cell does not have a likely proximate neighboring band to which it belongs then the step fails to error operation 630. If the band probability of the error memory cell meets the threshold and the error memory cell has a likely proximate neighboring band to which it belongs, control passes to rewriting operation 632.

At writing operation 632, the corrected data is written to the error memory cell. During this step, the error memory cell is assigned a corrected binary multi-bit value with the characteristic parameter value within the characteristic parameter band adjacent to the characteristic parameter band associated with the retrieved binary multi-bit such that the retrieved count and the stored count match for each binary multi-bit value. In one embodiment of the invention the entire memory cell collection to which the corrected memory cell belongs is refreshed during writing operation 632, thereby ensuring similar parametric shifts occur to the entire memory cell collection. After rewriting operation 632 is completed, control passes to determining operation 634.

At determining operation 634, a determination is made as to whether there are additional memory cell collections that require error detection and correction. If there are more memory cell collections that require error detection and correction then the system moves to the next memory cell collection and the control flow passes back to retrieving operation 610. If the memory cell collection is the last or only memory cell collection that requires data retrieval, error detection, and error correction the process ends.

Figure 7:
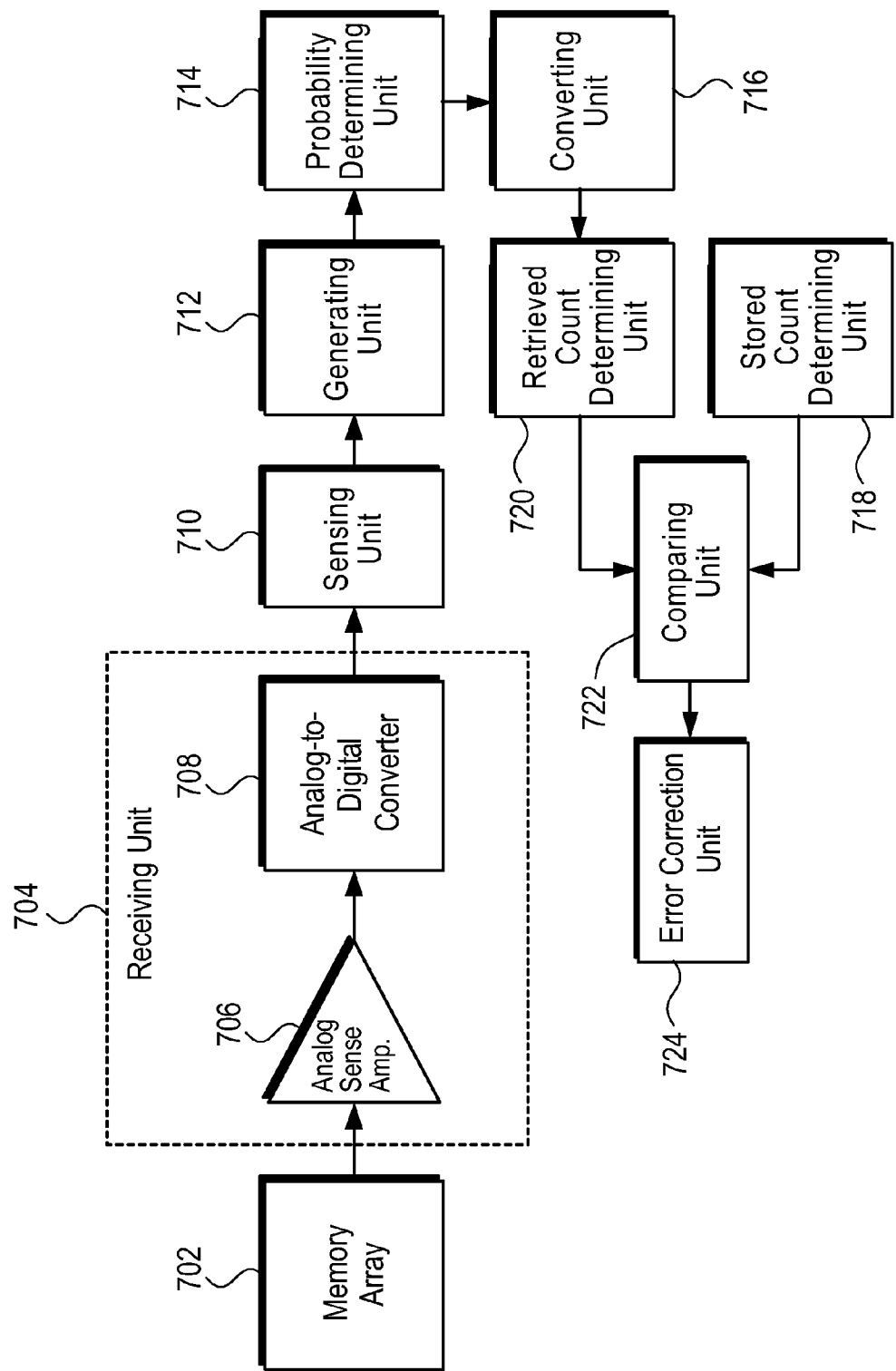
FIG. 7 illustrates an error detection and correction memory device according to one embodiment of the present invention.

Referring to FIG. 7, in one illustrative embodiment, the memory controller includes a receiving unit 704, a sensing unit 710, a generating unit 712, a probability determining unit 714, a converting unit 716, a stored count determining unit 718, a retrieved count determining unit 720, a comparing unit 712, and an error correction unit 724.

The receiving unit 704 receives the values of the characteristic parameter for each memory cell in a memory array 702. The memory cells examined by the receiving unit 704 may, for example, be addressed using a block address input to the memory array 702. More specifically, data is accessed by locating the block address of a memory array 702 including the data desired. The raw data is read as an analog signal by an analog sense amplifier 706. The analog sense amplifier 706 amplifies the signal and sends the signal to an analog-to-digital converter 708. The analog-to-digital converter 708 converts the analog signal to digital data that can be read and processed by the sensing unit 710. In one embodiment, the resolution of the analog-digital converter 708 is a multiple of the number of bits stored in each memory cell. For example, the resolution of the analog-to-digital converter 708 may have a resolution three times the number of bits stored per memory cell. For a memory cell storing two bits, the resolution would therefore equal six bits.

The sensing unit 710 receives the digital data from the receiving unit 704 and senses the shifted values in the characteristic parameter for each of the memory cells in the memory block. As mentioned above, the characteristic parameter values may shift due to a number of factors, such as, but not limited to, humidity, time, temperature, magnetic fields, and electrical fields.

The generating unit 712 receives the shifted characteristic parameter values and generates the probability distribution function of the characteristic parameter values for each of the stored binary multi-bit values from the memory block. Additionally, the generating unit 712 creates the normal distribution curves for the memory block with the probability distribution function. The mean and variance of these distribution curves/bands are also calculated by the generating unit 712.

The probability determining unit 714 determines a band probability that the stored characteristic parameter values from the memory block are within the probability distribution function for each of the stored binary multi-bit values. The band probabilities are derived from the probability determining unit 714.

The converting unit 716 converts the value of the characteristic parameter for the target memory cells into the binary multi-bit values for which the probability is highest.

The stored count determining unit 718 determines the stored cell counts for the memory cell collection prior to the data retrieval during the storage operations mentioned above. The retrieved count determining unit 720 determines the retrieved cell counts for the memory cell collection from the data passed on from the converting unit 716. The data from the stored count determining unit 718 and the retrieved count determining unit 720 is passed on to the comparing unit 722.

The comparing unit 722 compares the stored cell counts and the retrieved cell counts for each of the characteristic parameter bands in the memory cell collection. After determining the differences between the counts, the data from the comparing unit 722 moves to the error correction unit 722.

The error correction unit 722 evaluates the differences between the counts. If the difference between the retrieved and stored cell counts of the characteristic parameter band and the difference between the counts of the neighboring band do not match then the error correction unit 722 must transmit an error indication. The band probability is assigned to each memory cell from the probability determining unit 714, by the processes described above. The error correction unit 722 uses the cell count differences between neighboring characteristic parameter bands and the band probability in conjunction to identify and correct the error memory cell, as described above. In one embodiment of the system, if the band probability for the error memory cell from the probability determining unit 714 is below a threshold value then an error indication must be transmitted by the error correction unit 722. If not the corrected data is written to the error memory cell.

The aforementioned method for operating a memory cell system is compatible with both structural devices programmed and configured for the method and computer software written with computer executable instructions configured for the method.

Having described preferred embodiments for multi-level memory error detection and correction systems and methods (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for operating a memory cell collection storing binary data, the method comprising:

dividing a characteristic parameter of the memory cell collection into a plurality of characteristic parameter bands;

assigning a binary multi-bit value to each of the plurality of characteristic parameter bands;

converting the binary multi-bit values to be stored in the memory cell collection to characteristic parameter values, the characteristic parameter values being in the characteristic parameter band associated with the assigned binary multi-bit value corresponding to the binary multi-bit value;

storing the binary multi-bit values in the memory cell collection as the characteristic parameter values;

storing a stored count for each binary multi-bit value, the stored count being equal to the number of occurrences the binary multi-bit value is stored in the memory cell collection;

converting the stored characteristic parameter values to retrieved binary multi-bit values according to the assigned binary multi-bit values;

determining a retrieved count for each binary multi-bit value, the retrieved count being equal to the number of occurrences the binary multi-bit value is retrieved from the memory cell collection; and if the stored count of each binary multi-bit value is not equal to the retrieved count of each binary multi-bit value, the method further comprising:

a) for each memory cell in the memory cell collection, calculating a band probability that the stored characteristic parameter value belongs to the characteristic parameter band assigned to the binary multi-bit value;
b) identifying at least one error memory cell in the memory cell collection having a low band probability;
c) assigning the error memory cell a corrected binary multi-bit value with the characteristic parameter value within the characteristic parameter band adjacent to the characteristic parameter band associated with the retrieved binary multi-bit value such that the retrieved count is equal to the stored count for each binary multi-bit value.

2. The method of claim 1, wherein converting the stored characteristic parameter values to the retrieved binary multi-bit values includes:
sensing shifted values of the characteristic parameter for each of the memory cells in the memory cell collection;
generating a probability distribution function of the characteristic parameter values for each of the possible binary multi-bit values from the shifted values of the characteristic parameter for each of the memory cells in the memory cell collection;
determining a probability that the stored characteristic parameter values from the memory cell collection are within the probability distribution function for each of the possible binary multi-bit values; and
converting the stored characteristic parameter values from the memory cell collection into the retrieved binary multi-bit values for which the probability is highest.

3. The method of claim 1, further comprising transmitting an error indication if the difference between the stored count and the retrieved count of the binary multi-bit value assigned to the characteristic parameter band does not correspond to the difference between the stored count and the retrieved count of the binary multi-bit value assigned to the neighboring characteristic parameter band.

4. The method of claim 1, further comprising transmitting an error indication if the band probability of the error memory cell is above a maximum probability value.

5. The method of claim 1, wherein identifying the at least one error memory cell includes comparing the band probability to a probability threshold value such that a memory cell having the band probability above the probability threshold value is not the error memory cell.

6. The method of claim 1, wherein assigning the memory cell the corrected binary multi-bit value comprises storing the corrected binary multi-bit in the memory cell corresponding to the error memory cell.

7. The method of claim 1, further comprising:
storing a plurality of redundant counts for each binary multi-bit value assigned to the characteristic parameter band, each redundant count being equal to the number of occurrences the binary multi-bit value is stored in the memory cell collection;
determining the stored count for each binary multi-bit value assigned to the characteristic parameter band based on a count agreed upon by a majority of the redundant counts; and
transmitting an error indication if the count agreed upon by a majority of the redundant counts cannot be determined.

8. A memory device, comprising:
memory cells organized into a memory cell collection, each memory cell in the group storing an assigned binary multi-bit value delimited by characteristic parameter bands of a characteristic parameter;
a receiving unit configured to receive stored characteristic parameter values for each memory cell in the memory cell collection;
a sensing unit configured to sense shifted values in the characteristic parameter for each memory cell in the memory cell collection;
a generating unit configured to generate a probability distribution function of the characteristic parameter values for each of the stored binary multi-bit values from the shifted values of characteristic parameter for each memory cell in the memory cell collection;
a probability determining unit configured to determine a band probability that the stored characteristic parameter values from the memory cell collection are within the probability distribution function for each of the stored binary multi-bit values;
a converting unit configured to convert the stored characteristic parameter values from the memory cell collection into the retrieved binary multi-bit values for which the probability is highest; and
a stored count determining unit configured to determine a stored count for each binary multi-bit value stored in the memory cell collection, the stored count being the number of occurrences each binary multi-bit value is stored in the memory cell collection,
a retrieved count determining unit configured to determine a retrieved count for each binary multi-bit value retrieved from the memory cell collection, the retrieved count being the number of occurrences each binary multi-bit value is retrieved from the memory cell collection;
a comparing unit configured to compare the stored count of each binary multi-bit value with the retrieved count of each binary multi-bit value;
an error correcting unit configured to, if the retrieved count of each binary multi-bit value is not equal to the stored count of each binary multi-bit value:
a) receive the band probability that the stored characteristic parameter value belongs to the characteristic parameter band assigned to the binary multi-bit value;
b) identify at least one error memory cell having a low band probability; and
c) assign the error memory cell a corrected binary multi-bit value with a characteristic parameter value within the characteristic parameter band adjacent to the characteristic parameter band associated with the retrieved binary multi-bit value such that the retrieved count of each binary multi-bit value is equal to the stored count of each binary multi-bit value.

9. The memory device of claim 8, wherein the error correction unit is further configured to transmit an error indication if the difference between the stored count and the retrieved count of the binary multi-bit value assigned to the characteristic parameter band does not correspond to the difference between the stored count and the retrieved count of the binary multi-bit value assigned to the neighboring characteristic parameter band.

10. The memory device of claim 8, wherein the error correction unit is further configured to transmit an error indication if the band probability of the error memory cell is above a maximum probability value.

11. The memory device of claim 8, wherein the error correction unit is further configured to compare the band probability to a probability threshold value such that a memory cell having the band probability above the probability threshold value is not the error memory cell.

12. The memory device of claim 8, wherein the error correction unit is further configured to store the corrected binary multi-bit in the memory cell corresponding to the error memory cell.

13. The memory device of claim 8, further comprising a plurality of redundant counters, each configured to store a redundant count for each binary multi-bit value assigned to the characteristic parameter band, each redundant count being equal to the number of occurrences the binary multi-bit value is stored in the memory cell collection;
  wherein the stored count determining unit is further configured to determining the stored count for each binary multi-bit value assigned to the characteristic parameter band based on a count agreed upon by a majority of the redundant counters and to transmit an error indication if the count agreed upon by a majority of the redundant counters cannot be determined.

14. A computer program product comprising a tangible computer readable medium embodying computer program code for operating a memory cell collection, the memory cell collection comprising a plurality of memory cells, the memory cells storing binary multi-bit values delimited by characteristic parameter bands of an characteristic parameter, the computer program code comprising computer executable instructions for:
  storing a stored count for each binary multi-bit value, the stored count being equal to the number of occurrences the binary multi-bit value is stored in the memory cell collection;
  converting the stored characteristic parameter values to retrieved binary multi-bit values according to the assigned binary multi-bit values;
  determining a retrieved count for each binary multi-bit value, the retrieved count being equal to the number of occurrences the binary multi-bit value is retrieved from the memory cell collection; and
  if the stored count of each binary multi-bit value is not equal to the retrieved count of each binary multi-bit value, the computer executable instructions further comprising:
   a) for each memory cell in the memory cell collection, calculating a band probability that the stored characteristic parameter value belongs to the characteristic parameter band assigned to the binary multi-bit value;
   b) identifying at least one error memory cell in the memory cell collection having a low band probability; and
   c) assigning the error memory cell a corrected binary multi-bit value with the characteristic parameter value within the characteristic parameter band adjacent to the characteristic parameter band associated with the retrieved binary multi-bit value such that the retrieved count of each binary multi-bit value is equal to the stored count of each binary multi-bit value.

15. The computer program of claim 14, wherein converting the stored characteristic parameter values to the retrieved binary multi-bit values includes computer executable instructions for:
  sensing shifted values of the characteristic parameter for each memory cell in the memory cell collection;
  generating a probability distribution function of the characteristic parameter values for each of the possible binary multi-bit values from the shifted values of the characteristic parameter for each memory cell in the memory cell collection;
  determining a probability that the stored characteristic parameter values from the memory cell collection are within the probability distribution function for each of the possible binary multi-bit values; and
  converting the stored characteristic parameter values from the memory cell collection into the retrieved binary multi-bit values for which the probability is highest.

16. The computer program of claim 14, further comprising computer executable instructions for transmitting an error indication if the difference between the stored count and the retrieved count of the binary multi-bit value assigned to the characteristic parameter band does not correspond to the difference between the stored count of the and the retrieved count of the binary multi-bit value assigned to the neighboring characteristic parameter band.

17. The computer program of claim 14, further comprising computer executable instructions for transmitting an error indication if the band probability of the error memory cell is above a maximum probability value.

18. The computer program of claim 14, wherein the computer executable instructions for identifying the at least one error memory cell includes comparing the band probability to a probability threshold value such that a memory cell having the band probability above the probability threshold value is not the error memory cell.

19. The computer program of claim 14, wherein assigning the memory cell the corrected binary multi-bit value the computer executable instructions comprises storing the corrected binary multi-bit in the memory cell corresponding to the error memory cell.

20. The computer program of claim 14, further comprising computer executable instructions for:
  storing a plurality of redundant counts for each binary multi-bit value assigned to the characteristic parameter band, each redundant count being equal to the number of occurrences the binary multi-bit value is stored in the memory cell collection;
  determining the stored count for each binary multi-bit value assigned to the characteristic parameter band based on a count agreed upon by a majority of the redundant counts; and
  transmitting an error indication if the count agreed upon by a majority of the redundant counts cannot be determined.

* * * * *